(12) United States Patent
Arai et al.

(10) Patent No.: US 9,952,506 B2
(45) Date of Patent: Apr. 24, 2018

(54) LIQUID DISCHARGE APPARATUS, IMPRINT APPARATUS, AND ARTICLE MANUFACTURING METHOD

(71) Applicant: CANON KABUSHIKI KAISHA, Tokyo (JP)

(72) Inventors: Tsuyoshi Arai, Utsunomiya (JP); Tomonobu Saku, Utsunomiya (JP); Yutaka Mita, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 346 days.

(21) Appl. No.: 14/803,153

(22) Filed: Jul. 20, 2015

(65) Prior Publication Data

US 2016/0026084 A1    Jan. 28, 2016

(30) Foreign Application Priority Data

Jul. 25, 2014 (JP) .................................. 2014-152402
Jul. 2, 2015 (JP) .................................. 2015-133925

(51) Int. Cl.
*B41J 2/175* (2006.01)
*G03F 7/00* (2006.01)
*B29C 64/209* (2017.01)

(52) U.S. Cl.
CPC .......... *G03F 7/0002* (2013.01); *B29C 64/209* (2017.08); *B41J 2/17513* (2013.01); *B41J 2002/17516* (2013.01)

(58) Field of Classification Search
CPC .. B29C 64/209; G03F 7/0002; B41J 2/17513; B41J 2002/17516
See application file for complete search history.

(56) References Cited

U.S. PATENT DOCUMENTS 5,359,356 A * 10/1994 Ecklund ............... B41J 2/17513
 347/86
6,196,669 B1 * 3/2001 Harvey ................... B41J 2/175
 347/85

FOREIGN PATENT DOCUMENTS

| JP | 2008105360 A | * | 5/2008 |
| JP | 2008105360 A |   | 5/2008 |
| JP | 2014195950 A | * | 10/2014 |
| JP | 2014195950 A |   | 10/2014 |

* cited by examiner

*Primary Examiner* — Christina A Johnson
*Assistant Examiner* — Kelsey C Grace
(74) *Attorney, Agent, or Firm* — Rossi, Kimms & McDowell LLP

(57) ABSTRACT

A liquid discharge apparatus includes: a container divided by a dividing member into a first chamber configured to contain a first liquid to be discharged from a discharge port and a second chamber configured to contain a second liquid; a supply unit configured to supply the second liquid into the second chamber in accordance with decrease of the first liquid contained in the first chamber; and a measurement unit configured measure flow of the first liquid into the second chamber.

20 Claims, 7 Drawing Sheets

LIQUID DISCHARGE APPARATUS, IMPRINT APPARATUS, AND ARTICLE MANUFACTURING METHOD

BACKGROUND OF THE INVENTION

Field of the Invention

The present invention relates to an imprint apparatus, a liquid discharge apparatus for use in the imprint apparatus, and an article manufacturing method using the imprint apparatus.

Description of the Related Art

In a manufacturing process of semiconductor devices or the like, imprint apparatuses using an imprint technology have been in practical use as lithography apparatuses taking the place of exposure apparatuses. Imprint apparatuses include liquid discharge apparatuses for discharging imprint materials as liquid from discharge nozzles onto substrates. Japanese Patent Laid-Open No. 2008-105360 discloses an ink discharge apparatus in which a tank is divided by a flexible member into a container of ink (first liquid) and a buoyancy generating chamber, and negative pressure is applied to the ink by using buoyancy of a float disposed in the buoyancy generating chamber that is filled with a second liquid.

If the ink discharge apparatus described in Japanese Patent Laid-Open No. 2008-105360 is used as a discharge apparatus of an imprint material for an imprint apparatus, there may occur such an abnormality that a hole is generated in the flexible member partitioning the tank into the container of the imprint material and the buoyancy generating chamber containing the second liquid. In the discharge apparatus as set forth in Japanese Patent Laid-Open No. 2008-105360, if such a case occurs, it is concerned that the second liquid is mixed in the imprint material, thus deteriorating the quality of the imprint material to be discharged from the discharge apparatus, which might cause defects in products manufactured by the imprint apparatus.

SUMMARY OF THE INVENTION

The present invention provides a liquid discharge apparatus capable of detecting abnormality.

The present invention provides a liquid discharge apparatus comprising: a container divided by a dividing member into a first chamber configured to contain a first liquid to be discharged from a discharge port and a second chamber configured to contain a second liquid; a supply unit configured to supply the second liquid into the second chamber in accordance with decrease of the first liquid contained in the first chamber; and a measurement unit configured to measure flow of the first liquid into the second chamber.

Further features of the present invention will become apparent from the following description of exemplary embodiments with reference to the attached drawings.

DESCRIPTION OF THE EMBODIMENTS

Figure 1:
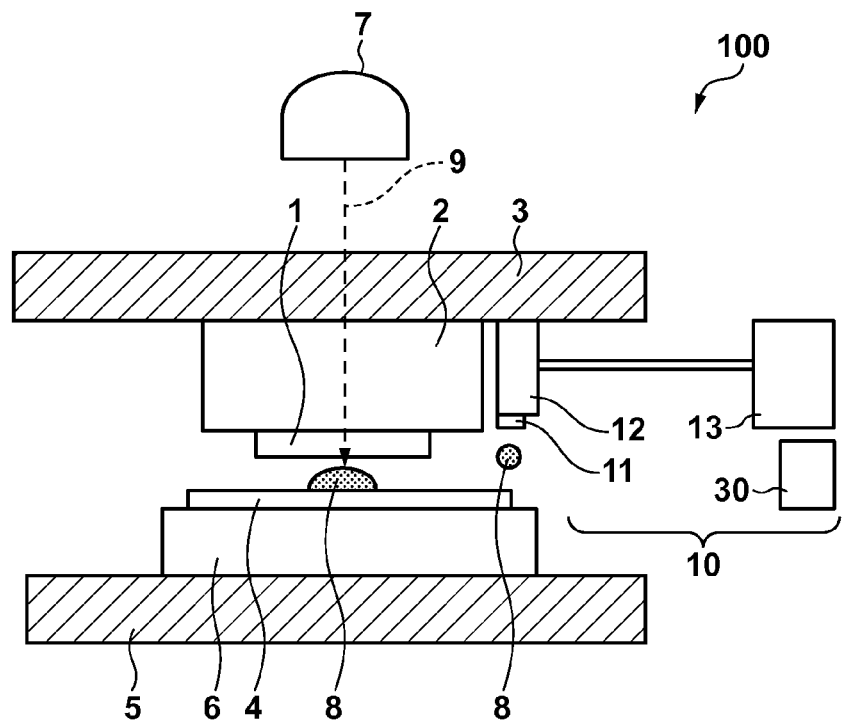
FIG. 1 is a drawing showing an imprint apparatus.

A liquid discharge apparatus according to an embodiment of the present invention, and an imprint apparatus using this apparatus will be described with reference to FIG. 1. An applicable scope of the liquid discharge apparatus according to the present invention is not limited to an imprint apparatus, and may be widely applicable to apparatuses equipped with mechanisms for discharging liquid, including industrial equipment such as semiconductor manufacturing apparatuses and liquid crystal manufacturing apparatuses, or consumer products such as printers. As an example of the present invention, there will be described a case that applies the present invention to a UV-curing type imprint apparatus that cures resin (imprint material) by radiating light (ultraviolet light). Needless to mention, the present invention may also be applicable to an imprint apparatus for curing resin by radiating light having another wavelength region, or an imprint apparatus for curing resin by using another energy (such as heat).

An imprint apparatus 100 discharges (applies, supplies) resin (imprint material) 8 onto a substrate 4 through a liquid discharge apparatus 10, and brings a mold 1 in contact with the discharged resin 8. In this state, the resin 8 is irradiated with an ultraviolet light 9 from an irradiation unit 7 so as to be cured, thereby carrying out pattern transfer. A fine rugged pattern is formed on the mold 1, so that an element pattern corresponding to the mold pattern can be formed on the substrate 4. A substrate stage 6 is movable on a base frame 5 while retaining the substrate 4. A mold driving unit 2 that drives the mold 1 upward and downward is retained by a structure 3 as to carry out a mold pressing operation that brings the mold 1 close to the substrate 4, and pushes the mold 1 against the substrate 4 via the resin 8. The irradiation unit 7 disposed above the mold 1 irradiates the resin 8 via the mold 1 with the ultraviolet light 9 so as to cure the resin 8. The ultraviolet light 9 may be a light source such as a halogen lamp that generates an i-ray or a g-ray, for example, and the irradiation unit 7 includes a function for concentrating and forming light generated by the light source.

An imprint operation of the present embodiment will be described as below. The substrate 4 is mounted on the substrate stage 6. The substrate 4 is moved under a discharge nozzle (discharge port) 11 of the liquid discharge apparatus (dispenser) 10 by the substrate stage 6. A predetermined amount of the resin 8 is discharged from the discharge nozzle 11 while moving the substrate stage 6 so as to discharge the resin 8 at a desired position on the substrate 4. Alternatively, while moving the liquid discharge apparatus 10 instead of moving the substrate stage 6, the resin 8 may be discharged on the substrate 4. The substrate stage 6 is moved such that a portion of the substrate 4 on which the resin 8 is discharged is positioned under the mold 1. The mold 1 is then moved downward by the mold driving unit 2 to be set close to the substrate 4. In this state, a mark on the mold 1 and a mark on the substrate 4 are detected by a not-shown alignment scope, and a relative positional adjustment between the mold 1 and the substrate 4 is carried out based on the detection result.

Subsequently, the mold 1 is further moved down toward the substrate 4 by the mold driving unit 2, and the resin 8 and the pattern of the mold 1 are brought into contact with each other. Thereafter, when the ultraviolet light 9 is radiated from the irradiation unit 7, the ultraviolet light 9 transmitted through the mold 1 is radiated onto the resin 8. Photo-curing reaction of the resin 8 is then started, and the resin 8 becomes cured. Finally, a distance between the mold 1 and the substrate 4 is widened by the mold driving unit 2, thereby moving the mold 1 apart from the cured resin 8 (mold releasing operation). Through this, the pattern is formed on the substrate 4, and the imprint operation is then completed.

Figure 2:
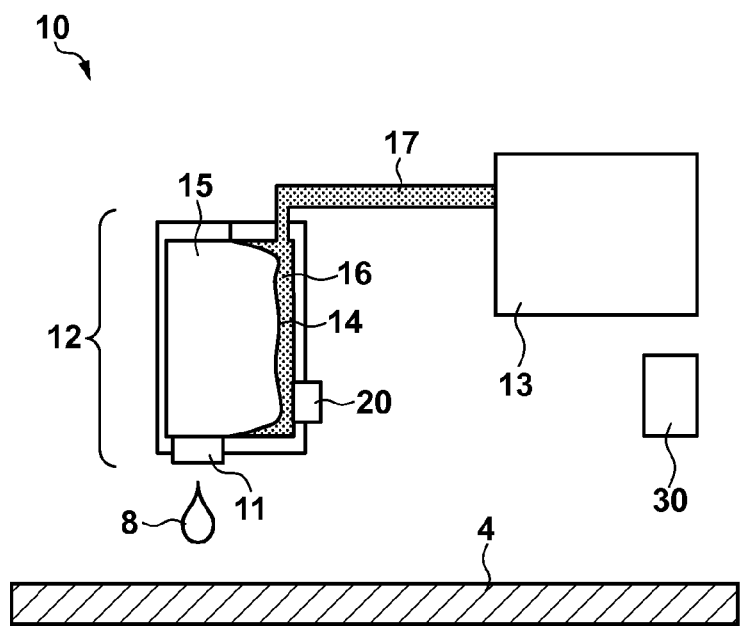
FIG. 2 is a typical schematic view of a liquid discharge apparatus according to the present invention.

FIG. 2 shows a configuration of the liquid discharge apparatus 10 in the present embodiment. The liquid discharge apparatus 10 includes the discharge nozzle 11, a container 12, and a measurement unit 20. A dividing member 14 dividing an inside of the container 12 into two spaces is provided in the container 12. In FIG. 2, the dividing member 14 is formed to be a partition wall, but may also be formed in a bag form. Of the two spaces divided by the dividing member 14, one space in communication with the discharge nozzle 11 is filled with resin (first liquid). This space is referred to as a resin containing portion (first chamber) 15. The discharge nozzle 11 is so controlled by a controller 30 as to discharge the resin 8 from the discharge nozzle 11. A nozzle using an ink-jet technology is suitable for the discharge nozzle 11. It may be unnecessary to provide the discharge nozzle 11 and the container 12 in an integral form, and it is only required that the discharge nozzle 11 is disposed to the container 12 in a manner as to be replaceable.

Of the two spaces in the container 12 divided by the dividing member 14, the other space out of communication with the discharge nozzle 11 is referred to as a liquid filler containing portion (second chamber) 16. The liquid filler containing portion 16 is filled with liquid filler (second liquid). Cooling water or the like for use in conventional exposure apparatuses may be used as the liquid filler. For example, a liquid formed by adding a preservative or a moisturizing agent into water may be used. The liquid filler containing portion 16 is in communication with a supply unit 13 that supplies the liquid filler via a communication unit 17. The dividing member 14 has a thickness of approximately 10 μm to 200 μm. As a material used for the dividing member 14, it is preferable to use a material having low liquid and gas permeability, such as an aluminum multi-layer film. The supply unit 13 includes a tank of the liquid filler, a pipe, a pressure sensor, a pump, a valve, and others. The pressure sensor, the pump, and the valve are connected to the controller 30 for the purpose of controlling the pressure of the liquid filler in the liquid filler containing portion 16 (second chamber). The controller 30 controls supply of the liquid filler from the supply unit 13, thereby indirectly controlling the pressure of the resin in the resin containing portion 15 via the dividing member 14. Accordingly, a shape of a discharge interface (meniscus) at the discharge nozzle 11 is stabilized, thus attaining preferable discharge with good reproducibility.

Based on a series of imprinting sequences, as discharge of the resin 8 from the discharge nozzle 11 is repetitively carried out, the resin inside the resin containing portion 15 becomes decreased, so that the flexible dividing member 14 becomes deformed and displaced. The dividing member 14 is deformed and displaced in accordance with decrease in volume of the resin containing portion 15, and increase in volume of the liquid filler containing portion 16. Depending on the displacement of the dividing member 14, the liquid filler is supplied to the liquid filler containing portion 16 from the tank of the liquid filler. In the resin for use in the imprint apparatus, content of foreign matters (fine particles) and metal ions should be reduced to the minimum limit, and the property of the resin should be preserved until the resin is discharged. The liquid discharge apparatus 10 according to the present invention can reserve the resin in a state of being isolated from the outside of the resin containing portion 15 during the entire period when the volume of the resin containing portion 15 is started to be decreased in accordance with the repetitive discharge of the resin until the resin is completely consumed. Accordingly, the resin is out of contact with the atmosphere and with equipment such as the pressure sensor. Hence, increase of foreign matters and metal ions is suppressed in the resin that is controlled at an initial stage to be sealed inside the resin containing portion 15.

Herein, it is assumed that there occurs abnormality such as leakage of the resin because of a hole (breakage) caused in the dividing member 14. If a hole is caused in the dividing member 14, the resin and the liquid filler are mutually mixed in the opposite spaces. Consequently, the quality of the resin to be discharged becomes significantly deteriorated. Eventually, devices produced by the imprint apparatus result in defective products. To counter this, the present invention provides a detecting mechanism that detects breakage in the dividing member 14 if the breakage occurs in the dividing member 14, and minimizes influence of the breakage; and details of this mechanism will be described with reference to FIG. 3. In the embodiment of the present invention, it is configured that a liquid of which density is lower than that of the resin is used as the liquid filler. It should be noted that there is used a liquid filler that is not mixed with the resin even if the resin intrudes into the liquid filler, and the resin and the liquid filler are separated from each other even when they are mixedly present.

Figure 3:
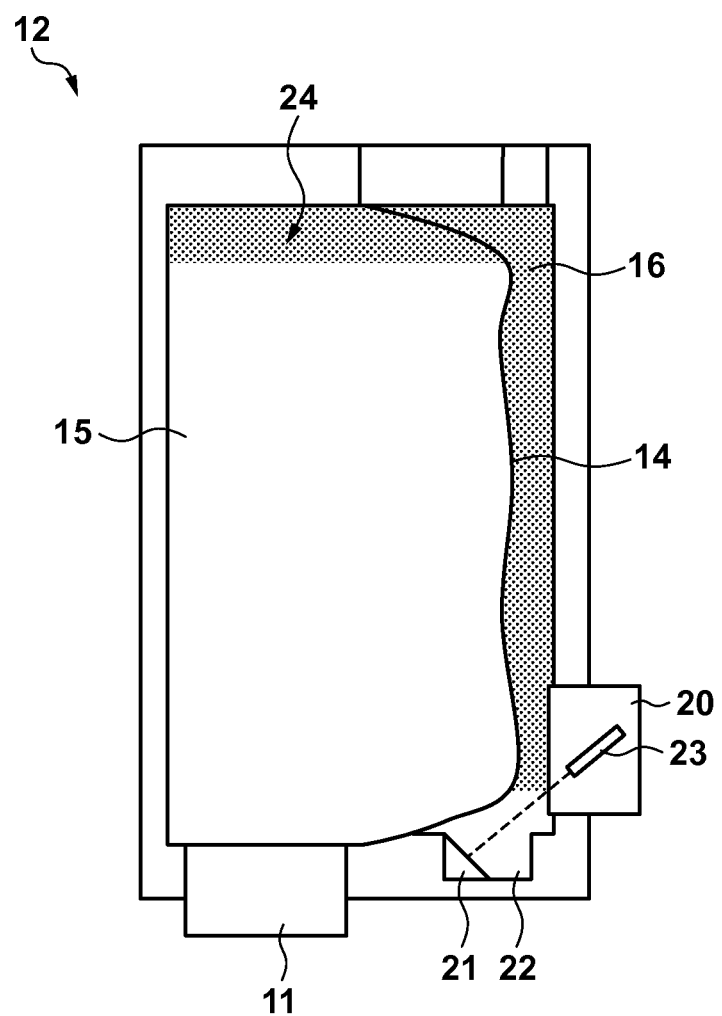
FIG. 3 is a detailed view of an embodiment of the liquid discharge apparatus according to the present invention.

If a hole (breakage) is caused in the dividing member 14, and the resin and the liquid filler are mixed in their opposite spaces inside the container 12, as shown in FIG. 3, the liquid filler intruding in the space of the resin containing portion 15 floats in an upper layer 24 of the resin (opposite side to the discharge nozzle 11 of the container 12). Since the discharge nozzle 11 is disposed at a lower position of the container 12, even if the liquid filler is mixed in the resin, the liquid filler is prevented from being immediately discharged from the discharge nozzle 11. To the contrary, if the resin of which density is greater than that of the liquid filler is mixed in the liquid filler containing portion 16, as shown in the lower right portion of FIG. 3, the resin sinks in a lower portion that is a part of the liquid filler containing portion 16. For this reason, there is provided a measurement area 22 (inspection area) where the liquid present in the lower portion of the inside of the liquid filler containing portion 16 is measured (inspected). This enables that the measurement unit 20 measures the liquid filler in the measurement area 22, and the controller 30 judges occurrence of breakage (abnormality) in the dividing member 14 based on the measurement result from the measurement unit 20.

The resin and the liquid filler are different liquids from each other, and have different refractive indexes (optical characteristics). Hence, by measuring the refractive index of the liquid present in the measurement area 22 on the measurement unit 20, it is possible to detect abnormality. The measurement unit 20 measuring the refractive index may include a sensor (laser displacement sensor) 23 that projects a laser beam into the liquid to measure a distance with a method of applying a trigonometrical survey. A target 21 is set in the measurement area 22, and light from the target 21 is received to measure a position of the target 21 on the sensor 23. If a liquid having a different refractive index flows into a laser optical path of the sensor 23, an measurement result varies. In addition, as an example of a sensor using an optical system, it may be configured to measure an angle of deviation at an interface between liquids having different refractive indexes. For the purpose of this, a reflection mirror and a prism may be disposed in the measurement area 22. It may also be configured to use a transparent member, such as glass, as a dividing member between the measurement unit 20 and the liquid filler containing portion 16, and project light obliquely from the measurement unit 20 toward the liquid filler containing portion 16 so that a critical angle of the light is measured, thereby measuring change in refractive index. Regardless of the refractive index, if the resin or the liquid filler has a color, or these liquids have a difference in transmittance of light, such a sensor that measures change in light intensity of projected light may be used.

Figure 4:
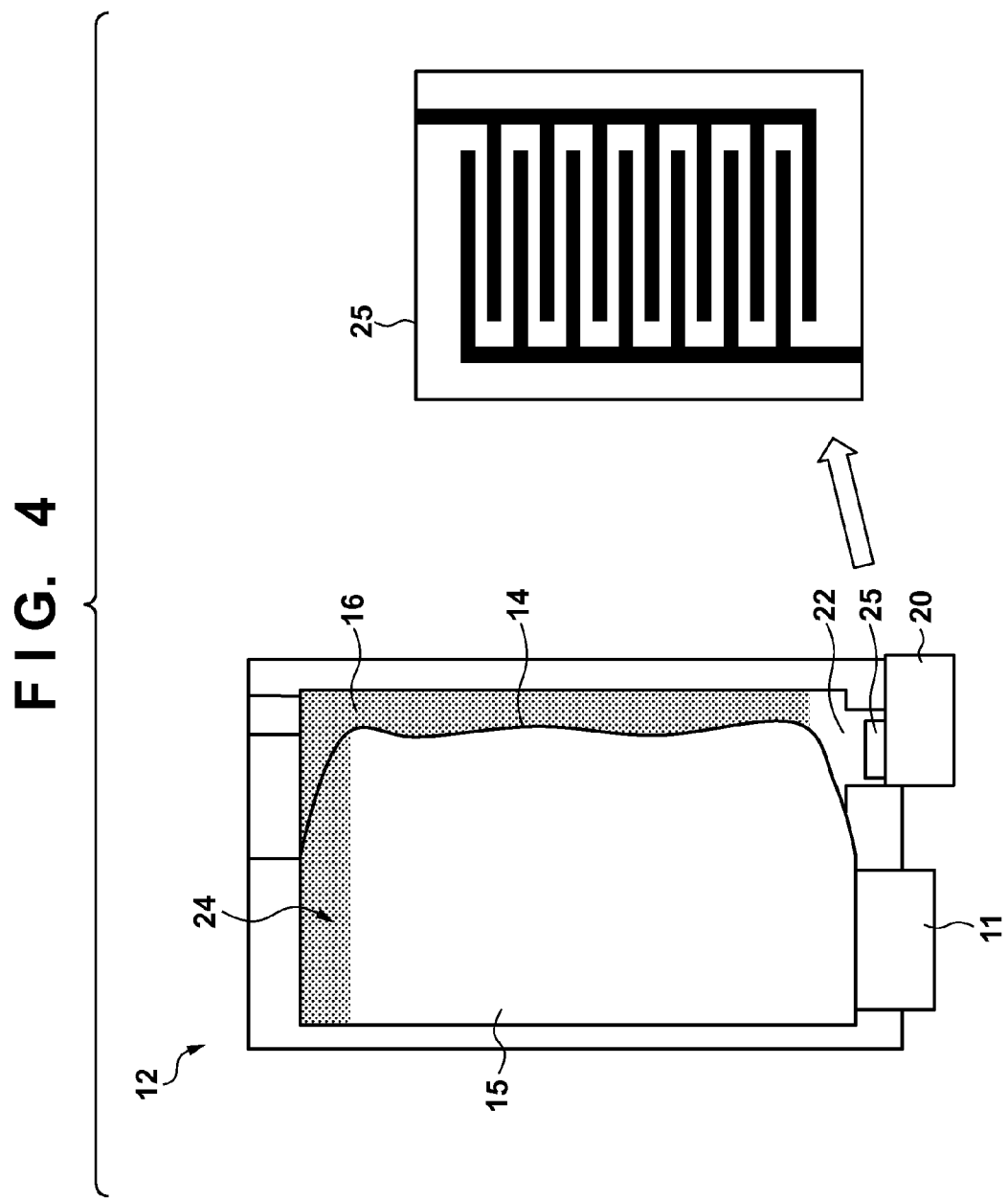
FIG. 4 is a detailed view of the embodiment of the liquid discharge apparatus according to the present invention.

If the resin is a non-conductive liquid and the liquid filler is a conductive liquid, the measurement unit 20 may include an electrode-type sensor 25. As shown in FIG. 4, the electrode-type sensor 25 includes two comb-shaped electrodes that are alternately arranged, and no current normally flows between these two electrodes, but if there exists a conductive liquid across these comb teeth, electricity flows therethrough. Hence, voltage is applied between the electrodes so that current flows while the electrodes are normally in contact with the conductive liquid filler; and if the electrode-type sensor 25 is surrounded by the resin, a resistance value changes or the current is interrupted. Needless to mention, if the resin is a conductive liquid, and the liquid filler is a non-conductive liquid, the reverse occurs.

These sensors may be disposed inside the container 12. In particular, it is preferable to dispose the sensors in the liquid filler containing portion 16. At a normal time when no abnormality occurs in the container 12, since the resin is a liquid whose pollution level is highly controlled, as aforementioned, and thus the sensors used for abnormality measurement should not pollute the resin. Hence, if the sensors are disposed in the liquid filler tolerant of pollution, it is possible to protect the resin in the resin containing portion 15 from intrusion of fine dust adhering to the sensors and or a slight amount of eluted substances from the sensors.

The sensor 23 (measurement unit 20) may be disposed to the outside of the container 12. For example, the measurement unit 20 is disposed in the imprint apparatus 100 in a manner as to measure the liquid filler in the measurement area 22 externally from the container 12. In this case, a window for measurement may be formed in the container 12. With this configuration, it is possible to measure abnormality from either the resin containing portion 15 side or the liquid filler containing portion 16 side of the container 12 without polluting the resin. In order to prevent the resin from reacting to the light, it is preferable to seal the periphery of the window for measurement, thereby blocking the light externally entering. Alternatively, it may configured to form the window for measurement using a member that prevents transmittance of the ultraviolet light, or attach to the window for measurement a film that prevents transmittance of the ultraviolet light. If the window for measurement is arranged on the liquid filler containing portion 16 side of the container 12, it is only necessary to form the dividing member 14 using a light-shielding material against the ultraviolet light. A wall structure that blocks light entering from the window for measurement so that the light does not reach the resin may be provided inside the liquid filler containing portion 16.

Figure 5:
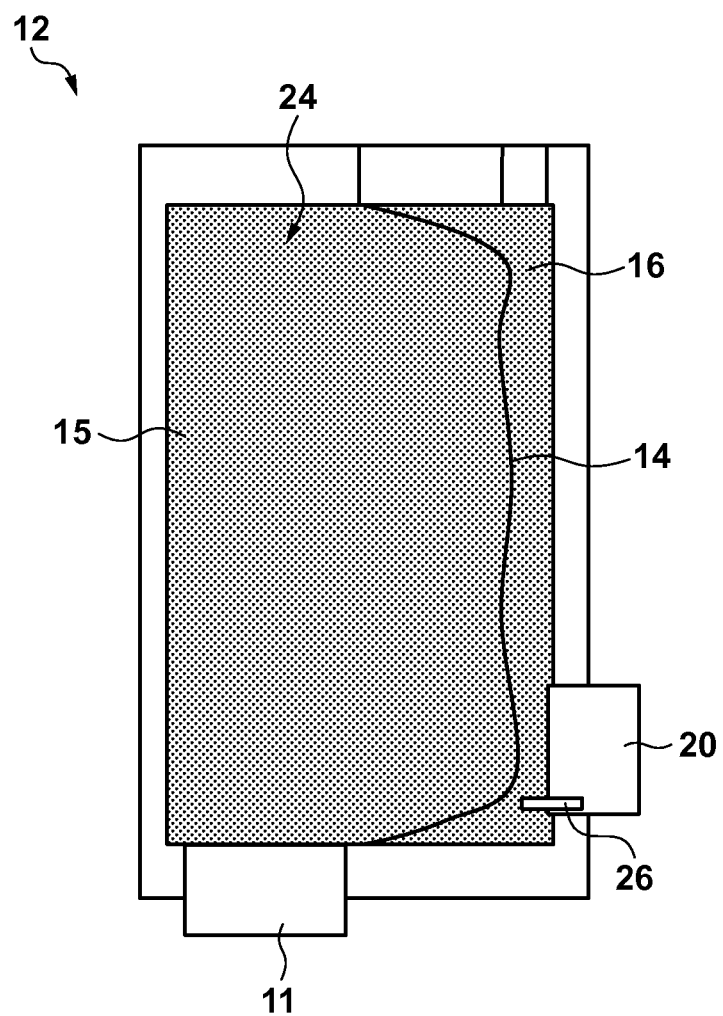
FIG. 5 is a detailed view of the embodiment of the liquid discharge apparatus according to the present invention.

In the aforementioned configurations, the liquid filler having a greater density than that of the resin may be employed. In this case, the liquid filler is collected at a bottom (on the discharge nozzle 11 side of the container 12) of the resin containing portion 15, and the resin is present at an upper position in the liquid filler containing portion 16. Hence, the measurement unit 20 may be arranged at the upper position in the liquid filler containing portion 16. Even if the resin and the liquid filler have the same density, or even if they are liquids that become mutually dissolved, it is possible to measure abnormality as far as the resin and the liquid filler have different properties of liquid from each other. Specifically, it may be configured to measure the liquid quality of the liquid filler so as to grasp its change in liquid quality, thereby judging the abnormality. In an example as shown in FIG. 5, the measurement unit 20 includes a liquid quality sensor 26. As the liquid quality sensor 26, an ion sensor capable of observing an ion concentration of the liquid, or a specific resistance sensor for measuring conductivity of the liquid may be suitable. It is preferable that the resin for use in the imprint apparatus contains no metal ions, and the ion concentration is reduced to the minimum limit. In the case of using the liquid filler formed of a material containing ions, if the resin in the resin containing portion 15 leaks into the liquid filler containing portion 16 due to breakage in the dividing member 14, the ion concentration of the liquid filler becomes decreased. Furthermore, another sensor for measurement of the liquid quality may be employed, such as a viscosity sensor, a transparency sensor, and a particle counter. In this case, the resin (first liquid) and the liquid filler (second liquid) have different viscosities and/or different transparencies, for example.

Based on the measurement result from the measurement unit 20, the controller 30 judges whether or not the resin should be discharged, and the controller 30 may stop the resin to be discharged from the discharge nozzle 11. In addition, the controller 30 may also include a mechanism for stopping the operation of the imprint apparatus. Through the aforementioned configurations, the abnormality measurement in the container 12 may be always carried out while the imprint apparatus and the liquid discharge apparatus are in operation. The abnormality measurement in the container 12 may be carried out not always, but a sequentially at a predetermined time interval, such as at a time of powering on the imprint apparatus, at a time of replacement of the container 12, at a maintenance time, at a time after processing a predetermined number of substrates, or after a prescribed time elapses. If abnormality is detected, the supply unit 13 may be operated to suck the liquid filler. Through this operation, negative pressure is generated inside the container 12, thereby preventing abnormal leakage of the liquid from the discharge nozzle 11. With the above described configurations, if abnormality of mixture between the resin and the liquid filler occurs, it is possible to rapidly stop the imprinting operation, thus preventing defects of devices continuously manufactured.

Figure 6:
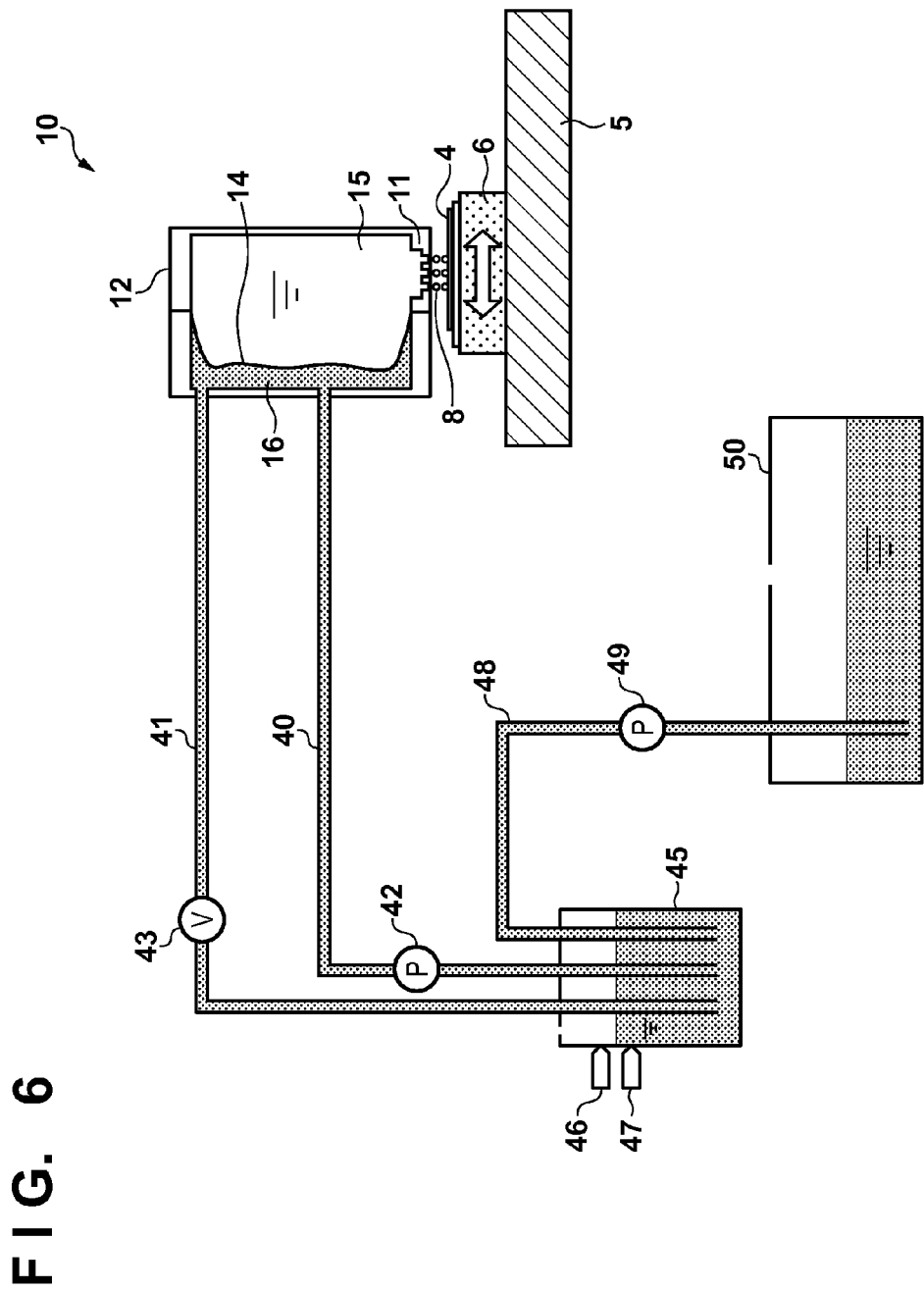
FIG. 6 is a detailed view of the embodiment of the liquid discharge apparatus according to the present invention.

Referring to FIG. 6, an embodiment of the liquid discharge apparatus 10 according to the present invention will be described. The liquid discharge apparatus 10 includes a sub-tank (tank) 45 that is in fluid-communication with the liquid filler containing portion 16 so as to adjust the pressure of the liquid filler in the liquid filler containing portion 16. The liquid filler containing portion 16 is in communication with the sub-tank 45 through a first fluid channel 40 and a second fluid channel 41, which may be tubes. In the liquid discharge apparatus 10, the pressure of resin (imprint material) at the discharge nozzle 11 is adjusted by means of the liquid filler in the sub-tank 45. The liquid discharge apparatus 10 according to this embodiment maintains the inside of the container 12 at a negative pressure (a state lower than the atmospheric pressure) so as to prevent liquid from unintentionally leaking out of the discharge nozzle 11.

The sub-tank 45 includes a sensor 46 for detecting an upper liquid level position of the sub-tank 45, and a sensor 47 for detecting a lower liquid level position of the sub-tank 45. The liquid level positions in the sub-tank 45 are detected by the sensor 46 and the sensor 47. An example of each of the sensors 46 and 47 that detect the upper and lower liquid level positions of the sub-tank 45 may be an optical sensor. Alternatively, each of the sensors 46 and 47 may be a type of sensor that includes electrode provided in the sub-tank 45 and detects energization due to contact of liquid with the electrode. Alternatively, the liquid level position in the sub-tank 45 may be detected by a capacitance-type sensor. Alternatively, a sensor may be employed that includes a float provided in the sub-tank 45 and detects the position of the float.

The sub-tank 45 is provided with a main tank fluid channel 48 that is in communication with the main tank 50. A liquid feed pump 49 is connected in communication with the main tank fluid channel 48. The liquid feed pump 49 is normally in a stop mode to achieve a state of breaking the flow of liquid. A pump 42 is provided in communication with the first fluid channel 40. A fluid channel valve 43 is provided in communication with the second fluid channel 41. Normally, the fluid channel in the pump 42 is opened to achieve a state of allowing the liquid to flow. On the contrary, the fluid channel valve 43 is closed to break the flow of liquid.

When the liquid discharge apparatus 10 operates to discharge the resin from the discharge nozzle 11, the dividing member 14 moves and the liquid filler is sucked from the sub-tank 45 to the container 12 through the first fluid channel 40. Consequently, the liquid level position of the liquid filler in the sub-tank 45 is lowered. When the sensor 47 for detecting the lower liquid level position of the sub-tank detects the lowered liquid level position, the liquid filler is supplied by the liquid feed pump 49 from the main tank 50 to the sub-tank 45. When the liquid level height of the liquid filler in the sub-tank 45 is raised and the sensor 46 for detecting the upper liquid level position in the sub-tank 45 detects the raised liquid level position, the liquid feeding operation of the liquid feed pump 49 is stopped. The liquid level height in the sub-tank 45 is controlled according to such a configuration, thereby controlling the pressure at the meniscus of the discharge nozzle 11 to fall within a predetermined range. It should be noted that the pressure control method is not limited to that using the head difference. Alternatively, a configuration may be employed that controls the pressure of gas in the sub-tank 45 to control the pressure at the meniscus of the discharge nozzle 11.

When the fluid channel valve 43 configured at the second fluid channel 41 is opened and the pump 42 provided at the first fluid channel 40 is operated, the liquid filler in the sub-tank 45 is supplied to the liquid filler containing portion 16 through the first fluid channel 40, which can form a circulation path passing through the second fluid channel 41 and returning to the sub-tank 45. Circulation of the liquid filler in the circulation path enables the liquid filler in the liquid filler containing portion 16 to be taken into the sub-tank 45. It is preferable that the circulating operation should be performed at any time when no liquid is discharged from the discharge nozzle 11. Alternatively, the circulating operation may always be performed while the pulsation of the pump 42 is limited.

Herein, it is assumed that there occurs abnormality such as leakage of the resin because of a hole (breakage) caused in the dividing member 14. If a hole is caused in the dividing member 14, the uncured resin (imprint material) and the liquid filler are mutually mixed in the opposite spaces. A part of the resin mixed in the liquid filler containing portion 16 moves into the sub-tank 45 by means of the operation of the circulation path. In the case of selecting materials that are not mixed with each other as the resin and the liquid filler as described above, the two liquids are brought into an isolated state in the sub-tank 45.

Figure 7:
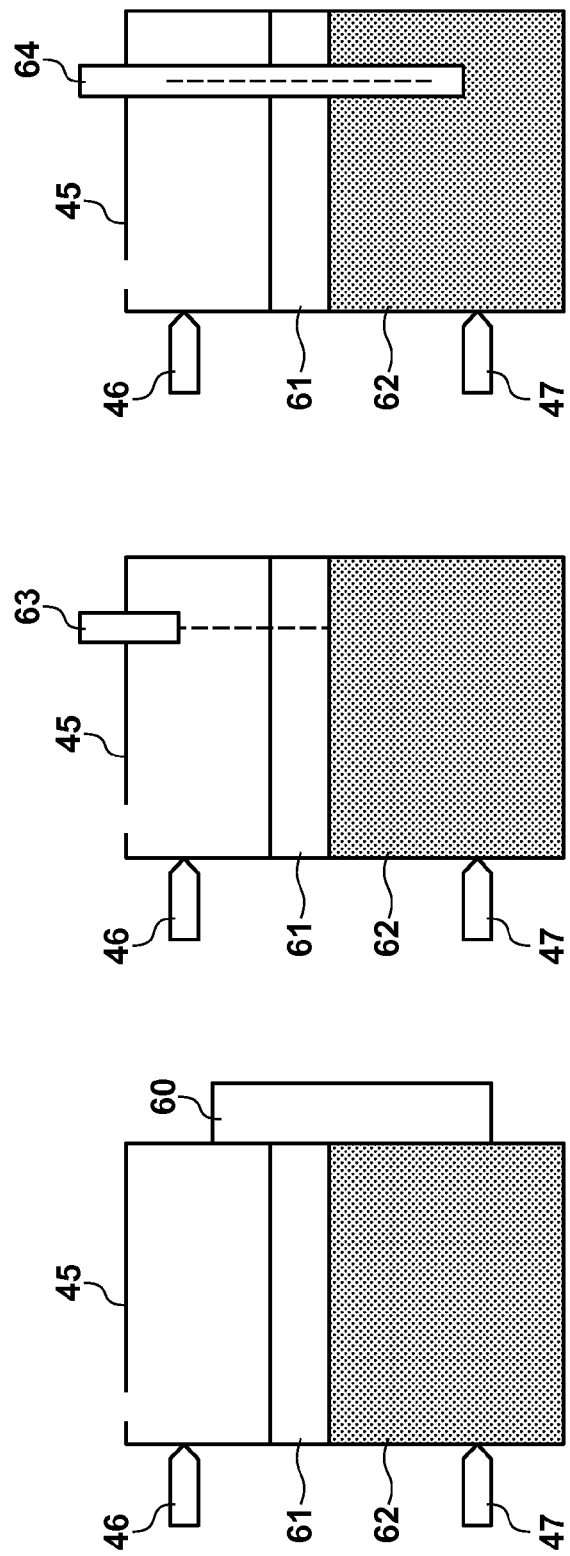
FIGS. 7A to 7C are detailed views of the embodiment of the liquid discharge apparatus according to the present invention.

FIGS. 7A to 7C show an example where the resin 61 and the liquid filler 62 coexist. It is assumed that the resin has the lower specific gravity, and is in a state where the resin 61 floats on the liquid filler 62. Needless to mention, if the resin has a greater specific gravity, the resin is in a lower layer in a reversed manner. FIG. 7A shows an example of a configuration where the liquid filler measurement unit 60 is provided at the sub-tank 45. The sensor employed for the liquid filler measurement unit 60 may be selected from among what detects the difference of the refractive indexes of liquids, what detects the interface between liquids, what detects the liquid color, what detects the liquid quality, and the like as described above.

Alternatively, as shown in FIG. 7B, an interface detection sensor 63, such as an optical sensor or a capacitance sensor, is provided at the sub-tank 45 to detect the interface between two liquids. In a normal mode, the liquid level height of the liquid filler is detected by means of a signal of reflection by the interface of the liquid filler 62. In an abnormal mode, two signals, or the signal of reflection by the interface between the resin 61 and air and the signal of reflection between the resin 61 and the liquid filler 62, are output. Consequently, the abnormality can be detected. Alternatively, as shown in FIG. 7C, an electrode-type sensor 64 may be provided in the sub-tank, and the presence of two liquids may be detected by means of the difference of resistances. The states of two liquids may be detected by the sensor 46 for detecting the upper liquid level position of the sub-tank and the sensor 47 for detecting the lower liquid level position of the sub-tank. During refill of the liquid filler from the main tank 50 to the sub-tank 45, if it is detected that the output of the liquid level position detection sensor is different from a normal output value only of the liquid filler, the presence of two liquids can be detected.

Figure 8:
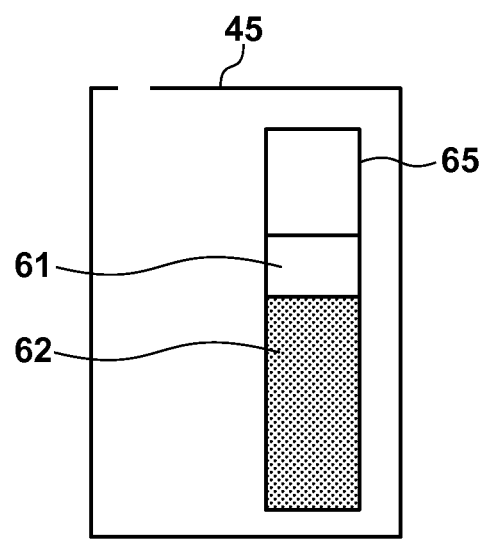
FIG. 8 is a detailed view of the embodiment of the liquid discharge apparatus according to the present invention.

Alternatively, as shown in FIG. 8, a configuration may be employed where the entire or a part of a sub-tank 45 is made of a transparent member 65, thereby allowing the presence of two liquids to be visually identified. The transparent window portion may be provided with a recording mechanism, such as a camera, thereby allowing continuous monitoring or recording.

[Article Manufacturing Method]

A manufacturing method of a device (such as a semiconductor integrated circuit device, a liquid crystal display device, and an MEMS) as an article includes a step of transferring (forming) a pattern on a substrate (such as a wafer, a glass plate, a film-type substrate) using the aforementioned imprint apparatus. The present manufacturing method may include a step of etching the substrate on which the pattern is transferred. In the case of manufacturing other articles, such as patterned media (memory media) and optical devices, the present manufacturing method may include another step of processing the substrate on which the pattern is transferred instead of the etching step.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-152402, filed Jul. 25, 2014 and Japanese Patent Application No. 2015-133925, filed Jul. 2, 2015, which are hereby incorporated by reference herein in their entirety.

What is claimed is:

1. A liquid discharge apparatus comprising:
a container divided by a dividing member into a first chamber containing a first liquid to be discharged from a discharge port and a second chamber containing a second liquid;
a supply unit configured to supply the second liquid into the second chamber in accordance with decrease of the first liquid contained in the first chamber; and
a measurement unit configured to measure flow of the first liquid into the second chamber.

2. The liquid discharge apparatus according to claim 1, wherein the first liquid is separated from the second liquid if the first liquid leaks into the second chamber.

3. The liquid discharge apparatus according to claim 2, wherein the first liquid has a greater density than that of the second liquid, and
wherein the measurement unit measures the first liquid present at a lower position in the second chamber.

4. The liquid discharge apparatus according to claim 2, wherein the first liquid has a lower density than that of the second liquid, and
wherein the measurement unit measures the first liquid present at an upper position in the second chamber.

5. The liquid discharge apparatus according to claim 1, wherein the measurement unit projects light into a liquid in the second chamber, and receives light from the liquid so as to measure an optical characteristics of the liquid, and
wherein in a wall of the second chamber, each of a portion on which light is projected from the measurement unit and a portion through which the light from the liquid is transmitted is formed as a window through which the light is transmitted, and
the wall of the second chamber excluding the portion on which the light is projected and the portion through which the light is transmitted, a wall of the first chamber, and the dividing member are formed in a light-shielding material.

6. The liquid discharge apparatus according to claim 5, wherein the first liquid has a different refractive index from that of the second liquid, and
wherein the measurement unit measures the refractive index of the liquid in the second chamber.

7. The liquid discharge apparatus according to claim 5, wherein the first liquid has a different transmittance from that of the second liquid, and
wherein the measurement unit measures amount of light transmitted through the liquid in the second chamber.

8. The liquid discharge apparatus according to claim 1, wherein the first liquid has a different conductivity from that of the second liquid, and wherein the measurement unit measures conductivity of a liquid in the second chamber.

9. The liquid discharge apparatus according to claim 1, wherein the first liquid has a different viscosity than that of the second liquid, and
wherein the measurement unit measures the viscosity of a liquid in the second chamber.

10. The liquid discharge apparatus according to claim 1, wherein the supply unit includes a tank which is in fluid-communication with the second chamber and configured to contain the second liquid to be supplied to the second chamber.

11. The liquid discharge apparatus according to claim 10, wherein the first liquid has a greater density than that of the second liquid, and wherein the measurement unit measures the first liquid present at a lower position in the tank.

12. The liquid discharge apparatus according to claim 10, wherein the first liquid has a lower density than that of the second liquid, and wherein the measurement unit measures the first liquid present at an upper position in the tank.

13. The liquid discharge apparatus according to claim 10, wherein the measurement unit projects light into a liquid present in the tank, and receives light from the liquid so as to measure optical characteristics of the liquid.

14. The liquid discharge apparatus according to claim 10, wherein the first liquid has a different conductivity from that of the second liquid, and wherein the measurement unit measures conductivity of a liquid present in the tank.

15. The liquid discharge apparatus according to claim 10, wherein the first liquid has a different viscosity from that of the second liquid, and wherein the measurement unit measures the viscosity of a liquid present in the tank.

16. The liquid discharge apparatus according to claim 1, further comprising
a controller configured to judge breakage in the dividing member based on a detection result from the measurement unit,
wherein if judging that the breakage occurs in the dividing member, the controller stops the first liquid to be discharged from the discharge port.

17. The liquid discharge apparatus according to claim 1, further comprising
a controller configured to judge breakage in the dividing member based on a detection result from the measurement unit,
wherein if judging that the breakage occurs in the dividing member, the controller controls the supply unit to suck the second liquid from the second chamber into the supply unit so as to generate negative pressure in the first chamber.

18. An imprint apparatus for forming a pattern on resin placed on a substrate, the imprint apparatus comprising
a liquid discharge apparatus configured to discharge the resin as a first liquid on the substrate,
wherein the liquid discharge apparatus includes:
a container divided by a dividing member into a first chamber configured to contain the first liquid to be discharged from a discharge port and a second chamber configured to contain a second liquid;
a supply unit configured to supply the second liquid into the second chamber in accordance with decrease of the first liquid contained in the first chamber; and
a measurement unit configured to measure flow of the first liquid into the second chamber.

19. The imprint apparatus according to claim 18, wherein the liquid discharge apparatus includes a controller configured to judge breakage in the dividing member at a time of powering on the imprint apparatus, at a time of replacement of the container, at a time after forming patterns on a predetermined number of substrates, or after a prescribed time elapses.

20. A method of manufacturing an article, the method comprising:
   forming a pattern on a substrate using the imprint apparatus; and
   processing the substrate, on which the pattern has been formed, to manufacture the article,
   the imprint apparatus comprising a liquid discharge apparatus configured to discharge the resin as a first liquid on the substrate,
   wherein the liquid discharge apparatus includes:
   a container divided by a dividing member into a first chamber containing the first liquid to be discharged from a discharge port and a second chamber containing a second liquid;
   a supply unit configured to supply the second liquid into the second chamber in accordance with decrease of the first liquid contained in the first chamber; and
   a measurement unit configured to measure flow of the first liquid into the second chamber.

* * * * *